US012757614B2

(12) United States Patent
Cho et al.

(10) Patent No.: US 12,757,614 B2
(45) Date of Patent: Oct. 6, 2026

(54) DISPLAY DEVICE

(71) Applicant: LG Display Co., Ltd., Seoul (KR)

(72) Inventors: Jungmo Cho, Seoul (KR); Yuri Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 667 days.

(21) Appl. No.: 18/087,565

(22) Filed: Dec. 22, 2022

(65) Prior Publication Data

US 2023/0217787 A1 Jul. 6, 2023

(30) Foreign Application Priority Data

Dec. 30, 2021 (KR) ........................ 10-2021-0192487
Nov. 14, 2022 (KR) ........................ 10-2022-0151938

(51) Int. Cl.
*H10K 59/80* (2023.01)
*H10K 59/121* (2023.01)
*H10K 59/35* (2023.01)

(52) U.S. Cl.
CPC ....... *H10K 59/873* (2023.02); *H10K 59/1213* (2023.02); *H10K 59/35* (2023.02); *H10K 59/879* (2023.02)

(58) Field of Classification Search
CPC .. H10K 59/873; H10K 59/1213; H10K 59/35; H10K 59/879; H10K 50/858; H10K 50/844; H10K 59/00; H10K 59/80–88; H10K 59/70; H10K 59/87–874; Y02E 10/549; G09F 9/335; H01L 23/28–3192
See application file for complete search history.

(56) References Cited

U.S. PATENT DOCUMENTS

2012/0223873 A1 9/2012 Ohta
2013/0065476 A1* 3/2013 Kim .................. H10K 59/8722 445/24
2015/0137082 A1* 5/2015 Kim ...................... H10K 59/35 257/40

(Continued)

FOREIGN PATENT DOCUMENTS

CN 111540838 A 8/2020
EP 4 125 142 A1 2/2023

(Continued)

*Primary Examiner* — Chad M Dicke
*Assistant Examiner* — Gary Abel
(74) *Attorney, Agent, or Firm* — Birch, Stewart, Kolasch & Birch, LLP

(57) ABSTRACT

A display device can include a substrate having a display area including a plurality of light emitting diodes, a first non-display area, and a bending area disposed between the first non-display area and the display area; a first inorganic encapsulation layer on the plurality of light emitting diodes; and a data driver in the first non-display area, in which the substrate is configured to be bent at the bending area for locating a portion of the first non-display area that includes the data driver under or behind a portion of the display area, and the first inorganic encapsulation layer includes a first region configured to overlap with the data driver and a second region that does not overlap with the data driver, the first region of the first inorganic encapsulation layer having a higher refractive index than the second region of the first inorganic encapsulation layer.

19 Claims, 8 Drawing Sheets

(56) References Cited

U.S. PATENT DOCUMENTS

| | | | | |
|---|---|---|---|---|
| 2018/0062113 | A1 | 3/2018 | Sung et al. | |
| 2019/0355761 | A1 | 11/2019 | Chang et al. | |
| 2020/0127231 | A1 | 4/2020 | Yun et al. | |
| 2021/0005838 | A1* | 1/2021 | Pschenitzka | H10K 59/879 |
| 2021/0083019 | A1* | 3/2021 | Jang | H10K 59/65 |
| 2021/0217989 | A1* | 7/2021 | Gao | H10K 59/879 |
| 2021/0320284 | A1* | 10/2021 | Park | H10K 59/40 |
| 2022/0085334 | A1 | 3/2022 | Oh et al. | |
| 2022/0093899 | A1 | 3/2022 | Hyun et al. | |
| 2022/0189358 | A1* | 6/2022 | Kim | H10K 59/123 |
| 2023/0102208 | A1* | 3/2023 | Hong | H10K 59/8791<br>257/89 |

FOREIGN PATENT DOCUMENTS

| | | | |
|---|---|---|---|
| JP | 2007-134153 | A | 5/2007 |
| JP | 2019-57416 | A | 4/2019 |
| JP | 2021-107918 | A | 7/2021 |
| KR | 10-2008-0053193 | A | 6/2008 |
| KR | 10-2015-0076595 | A | 7/2015 |
| KR | 10-2016-0029119 | A | 3/2016 |
| KR | 10-2019-0074037 | A | 6/2019 |
| KR | 10-2019-0108793 | A | 9/2019 |
| KR | 10-2021-0025145 | A | 3/2021 |
| TW | 201929599 | A | 7/2019 |
| WO | WO 2020/246668 | A1 | 12/2020 |

* cited by examiner

DISPLAY DEVICE

CROSS-REFERENCE TO RELATED APPLICATIONS

This application claims priority to Korean Patent Application No. 10-2021-0192487 filed in the Republic of Korea on Dec. 30, 2021, and Korean Patent Application No. 10-2022-0151938 filed in the Republic of Korea on Nov. 14, 2022, the entireties of all these applications are incorporated by reference into the present application.

BACKGROUND

Field

The present disclosure relates to a display device, and more particularly, to a display device in which a lifespan of a blue light emitting diode can be improved and the luminous efficiency can be optimized.

Description of the Related Art

As the age of information technology has proceeded, the field of display devices for visually displaying electrical information signals has grown rapidly. Thus, various studies have been carried out for developing technologies display devices that are thinner, lighter in weight, and consume less power.

Representative examples of the display devices can include a Liquid Crystal Display (LCD) device, a Field Emission Display (FED) device, an Electro-Wetting Display (EWD) device, an Organic Light Emitting Display (OLED) device, and the like.

Particularly, electro-luminescent display devices including the OLED device are self-light emitting display devices and do not need a separate light source unlike the LCD device (e.g., no backlight is needed). Thus, the electro-luminescent display devices can be manufactured in a light-weight and thin form. Further, the electro-luminescent display devices are advantageous in terms of power consumption since they are driven with a low voltage. Also, the electro-luminescent display devices have excellent color expression, a high response speed, a wide viewing angle and a high contrast ratio (CR). Therefore, the electro-luminescent display devices are expected to be applied in various fields. However, overtime, an electro-luminescent display device can experience diminished brightness and a pinkish or yellowish color shift may occur as the blue light emitting diodes degrade at a faster rate than the other light emitting diodes, which impairs image quality and color reproduction.

SUMMARY OF THE DISCLOSURE

An object to be achieved by the present disclosure is to provide a display device in which a pinkish or yellowish color shift can be improved by improving a lifespan of a blue light emitting diode.

Another object to be achieved by the present disclosure is to provide a display device in which a lifespan of a blue light emitting diode can be improved and the luminous efficiency can be optimized by minimizing a region where the luminous efficiency decreases.

Objects of the present disclosure are not limited to the above-mentioned objects, and other objects, which are not mentioned above, can be clearly understood by those skilled in the art from the following descriptions.

According to an aspect of the present disclosure, the display device includes a substrate including a display area where a plurality of pixels is disposed, a bending area extending from one side of the display area to be bent, and a non-display area having a first non-display area extending from the bending area. Also, the display device includes a plurality of transistors and a plurality of light emitting diodes disposed on the substrate corresponding to the plurality of pixels, respectively. Further, the display device includes an encapsulation unit disposed on the plurality of light emitting diodes and including a first inorganic encapsulation layer, an organic encapsulation layer and a second inorganic encapsulation layer. Furthermore, the display device includes a data driver disposed in the first non-display area and configured to transfer a signal to the display area. The substrate is bent at the bending area and the first non-display area is disposed under the display area. The first inorganic encapsulation layer includes a first region overlapping with the data driver and a second region except the first region with a lower refractive index than the first region.

According to another aspect of the present disclosure, the display device includes a display panel including a display area where an image is displayed, a non-display area enclosing the display area, and a bending area extending from the non-display area. Also, the display device includes a plurality of light emitting diodes disposed in the display area and a first inorganic encapsulation layer disposed on the plurality of light emitting diodes. Further, the display device includes an organic encapsulation layer disposed on the first inorganic encapsulation layer and a second inorganic encapsulation layer disposed on the organic encapsulation layer. Furthermore, the display device includes a data driver connected to the bending area and disposed on a rear surface of the display panel and configured to transfer a signal to the display panel. The first inorganic encapsulation layer includes a first region disposed corresponding to the data driver and a second region having a lower refractive index than the first region.

Other detailed matters of the example embodiments are included in the detailed description and the drawings.

According to the present disclosure, a lifespan of a blue light emitting diode, which is vulnerable to a high temperature environment, can be improved by increasing the refractive index of a first inorganic encapsulation layer.

According to the present disclosure, a pinkish or yellowish color shift can be improved or prevented by making up the difference in lifespans between a blue light emitting diode and the other color light emitting diodes.

According to the present disclosure, a decrease in luminous efficiency of a light emitting diode can be prevented or minimized by limiting an area where the refractive index of the first inorganic encapsulation layer is increased to an area overlapping with a data driver.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1A:
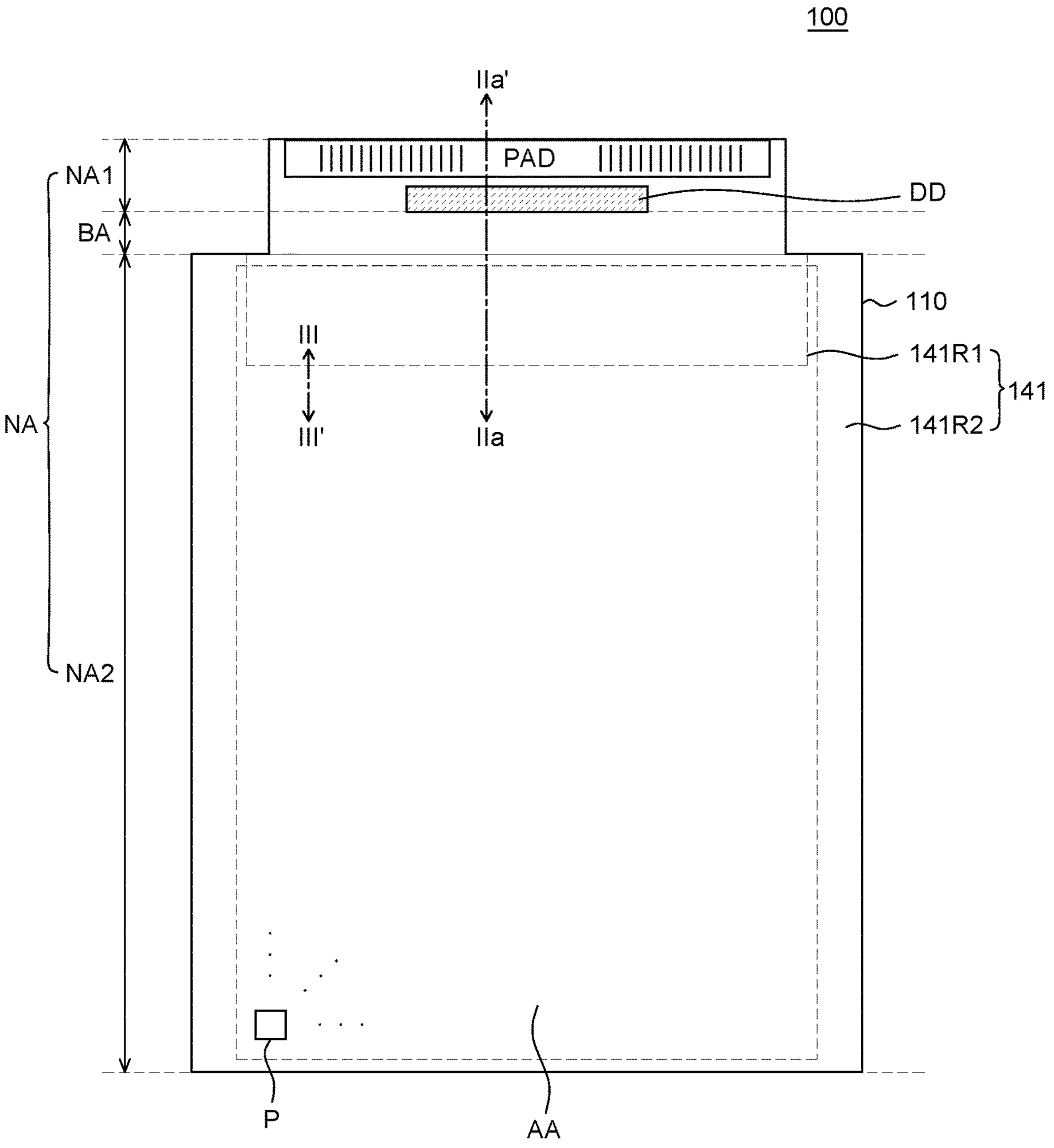
FIG. 1A is a schematic plan view of a display device according to an embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as “including,” “having,” and “consist of” used herein are generally intended to allow other components to be added unless the terms are used with the term “only.” Any references to singular can include plural unless expressly stated otherwise.

Components are interpreted to include an ordinary error range even if not expressly stated.

When the position relation between two parts is described using the terms such as “on,” “above,” “below,” and “next,” one or more parts can be positioned between the two parts unless the terms are used with the term “immediately” or “directly.”

When an element or layer is disposed “on” another element or layer, another layer or another element can be interposed directly on the other element or therebetween.

Although the terms “first,” “second,” and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various embodiments of the present disclosure will be described in detail with reference to accompanying drawings.

FIG. 1A is a schematic plan view of a display device according to an example embodiment of the present disclosure. For the convenience of description, FIG. 1A illustrates only a substrate 110, a pad unit PAD, a data driver DD and a first inorganic encapsulation layer 141 among various components of a display device 100.

Referring to FIG. 1A, the substrate 110 includes a display area AA and a non-display area NA.

The substrate 110 is a base member for supporting various components of the display device 100 and can be made of an insulating material. For example, the substrate 110 can be made of glass or a plastic material such as polyimide.

The display area AA is an area where a plurality of pixels P are disposed to display an image. In each of the plurality of pixels P in the display area AA, a light emitting diode for displaying an image and a driving unit for driving the light emitting diode can be disposed. For example, if the display device 100 is an organic light emitting display device, the light emitting diode can be an organic light emitting diode including an anode, an organic layer and a cathode. The driving unit can be composed of various components, such as a power line, a gate line, a data line, a transistor and a storage capacitor, for driving the organic light emitting diode. Hereinafter, the display device 100 will be assumed as an organic light emitting display device for the convenience of description, but the display device 100 is not limited to the organic light emitting display device.

In addition, each of a plurality of pixels P in the display area AA can include three or more sub-pixels that emit light of different colors from one another. For example, each of the plurality of pixels P can include a red sub-pixel, a green sub-pixel and a blue sub-pixel. Also, a light emitting diode and a transistor disposed in each of the plurality of pixels P can be disposed corresponding to each of the red sub-pixel, the green sub-pixel and the blue sub-pixel. However, each of the plurality of pixels P can further include a white sub-pixel, but is not limited thereto. The red sub-pixel, the green sub-pixel and the blue sub-pixel disposed in the plurality of pixels P will be described in detail with reference to FIG. 5A and FIG. 5B.

The non-display area NA is an area where an image is not displayed and various lines and circuits for driving display elements disposed in the display area AA are disposed. For example, the data driver DD, a gate driver, a link line and the pad unit PAD can be disposed in the non-display area NA.

The non-display area NA can extend from the display area AA, but is not limited thereto. The non-display area NA can enclose or surround the display area AA.

The non-display area NA includes a first non-display area NA1, a bending area BA and a second non-display area NA2. The second non-display area NA2 extends from the display area AA. The bending area BA extends from the second non-display area NA2 and can be bent. The first non-display area NA1 extends from the bending area BA. The bending area BA is between the display area AA and the first non-display area.

In the first non-display area NA1, the data driver DD, the pad unit PAD and the like can be disposed. In the pad unit PAD, pads connected to various signal lines or a printed circuit board (PCB) are disposed. In the pad unit PAD, a power supply pad, a data pad, a gate pad, etc. can be disposed.

The data driver DD can be mounted on or connected to a separate PCB substrate to be connected to a display panel through the pad unit PAD. Alternatively, the data driver DD can be mounted or connected between the pad unit PAD and the display area AA by a Chip On Panel (COP) method. The data driver DD includes at least one source drive integrated circuit (IC). The at least one source drive IC receives digital video data and a source timing control signal from a timing controller. The at least one source drive IC converts the digital video data into a gamma voltage in response to the source timing control signal and generates a data voltage. Then, the at least one source drive IC supplies the data voltage through the data line disposed in the display area AA.

A plurality of bending patterns are disposed in the bending area BA. The bending area BA can be bent in the final product (e.g., at the time of final assembly). As the bending area BA is bent, cracks may be formed due to stress concentrated at the bending patterns disposed in the bending area BA. Therefore, the bending patterns can be formed into a pattern of a specific shape to minimize or prevent crack formation. For example, the bending patterns can employ repeated patterns having at least one of a diamond shape, a rhombic shape, a zigzag shape, a wavy shape, a curvy shape or a circular shape. The bending patterns can have another shape to minimize stress and prevent cracks from being concentrated on the bending patterns, but are not limited thereto.

The second non-display area NA2 can also be disposed between the bending area BA and the display area AA. In the second non-display area NA2, link lines such as a power link line and a data link line can be disposed. That is, the second non-display area NA2 serves to transfer a signal output from the driving unit to the display area AA. If the substrate 110 includes an abnormal-shaped corner, the second non-display area NA2 can correspond in shape of the substrate 110 and the display area AA.

In addition, FIG. 1A illustrates that the first inorganic encapsulation layer 141 is disposed on the substrate 110 and the first inorganic encapsulation layer 141 includes a first region 141R1 and a second region 141R2. However, the first region 141R1 and the second region 141R2 of the first inorganic encapsulation layer 141 will be described in more detail with reference to FIG. 1B through FIG. 3.

First, a plurality of pixels P of the display device 100 will be described in more detail with reference to FIG. 1B through FIG. 3.

Figure 1B:
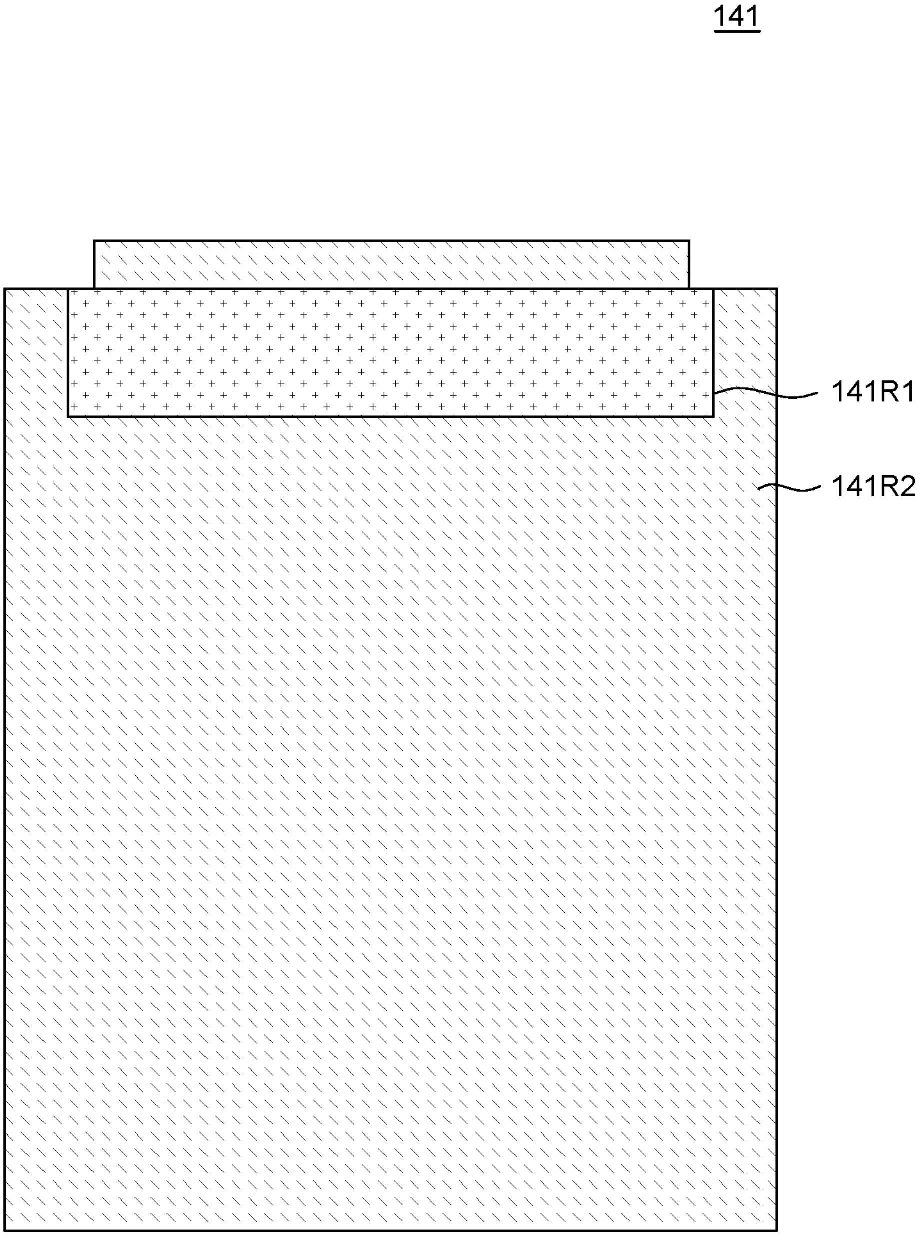
FIG. 1B is a plan view illustrating a first inorganic encapsulation layer of the display device according to an embodiment of the present disclosure.
Figure 2A:
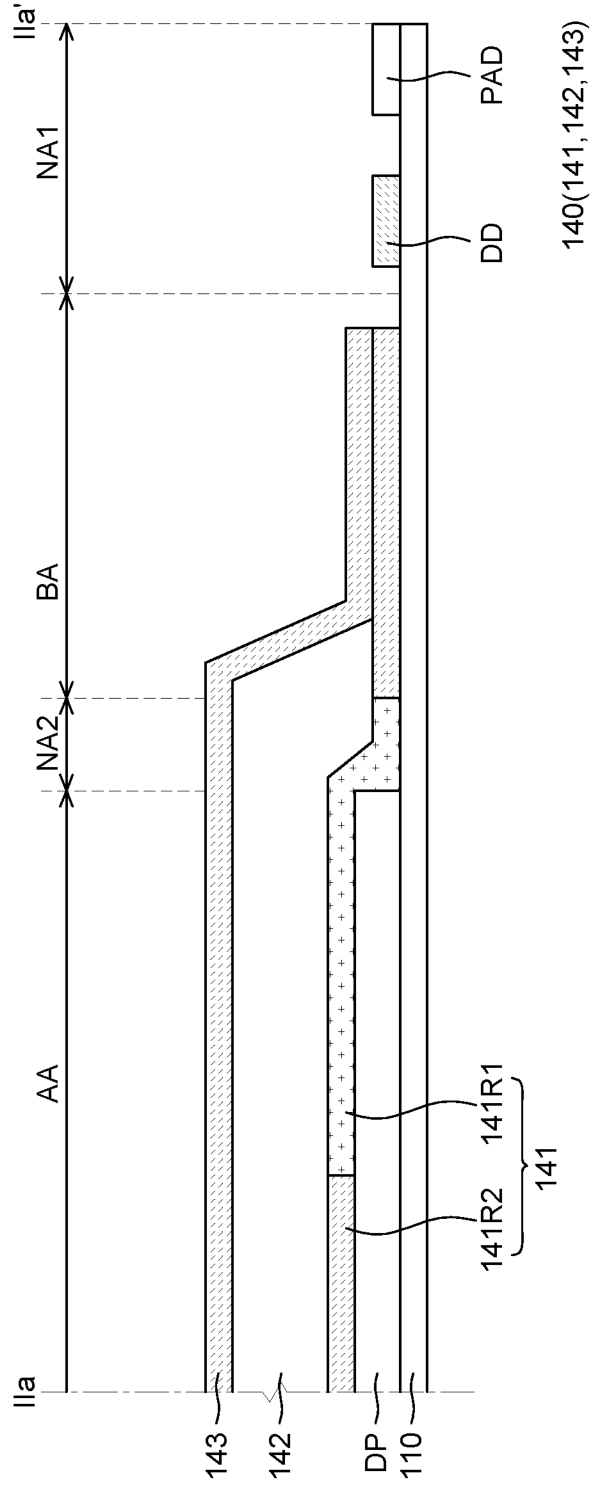
FIG. 2A is a cross-sectional view as taken along a line IIa-IIa' of FIG. 1A according to an embodiment of the present disclosure.
Figure 2B:
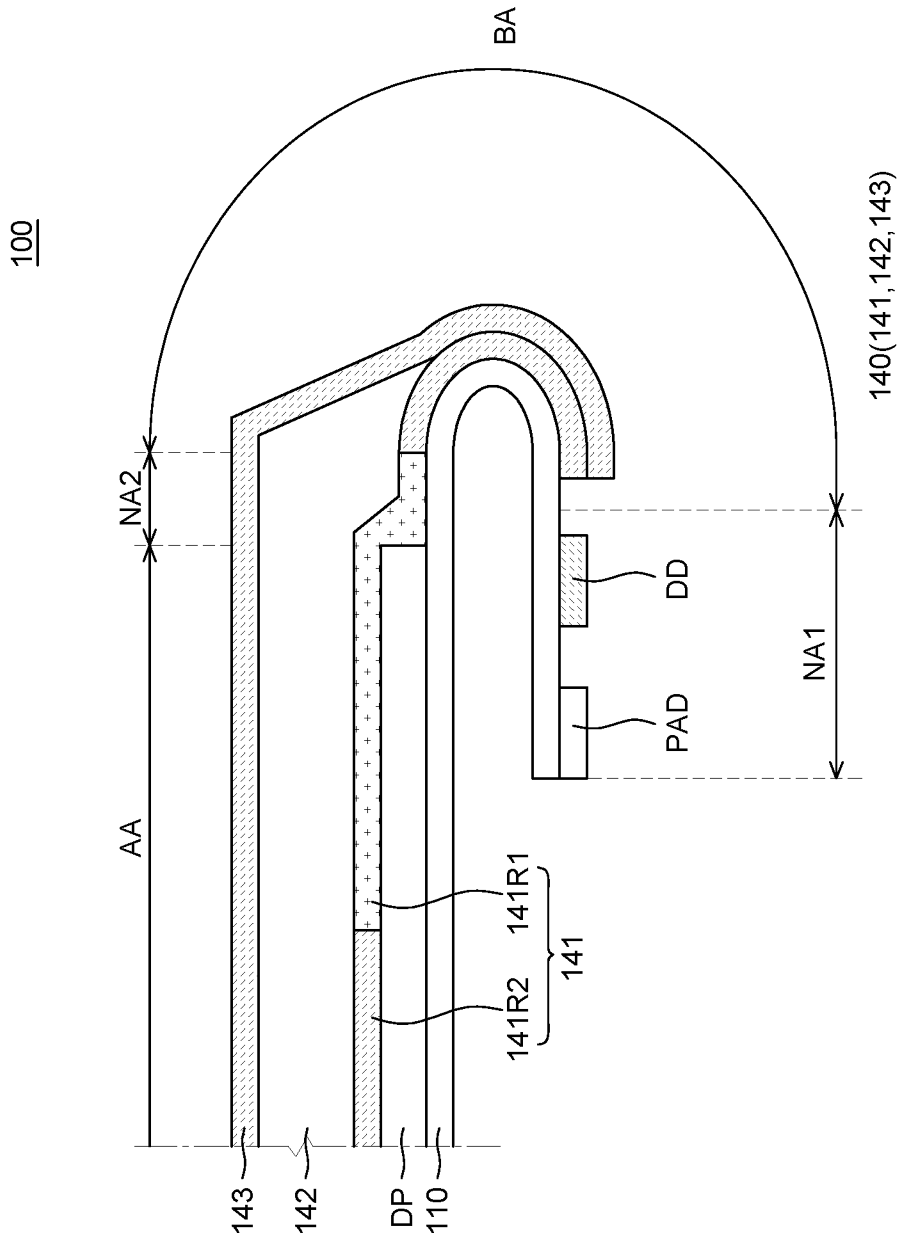
FIG. 2B is a cross-sectional view when the display device is bent according to an embodiment of the present disclosure.
Figure 3:
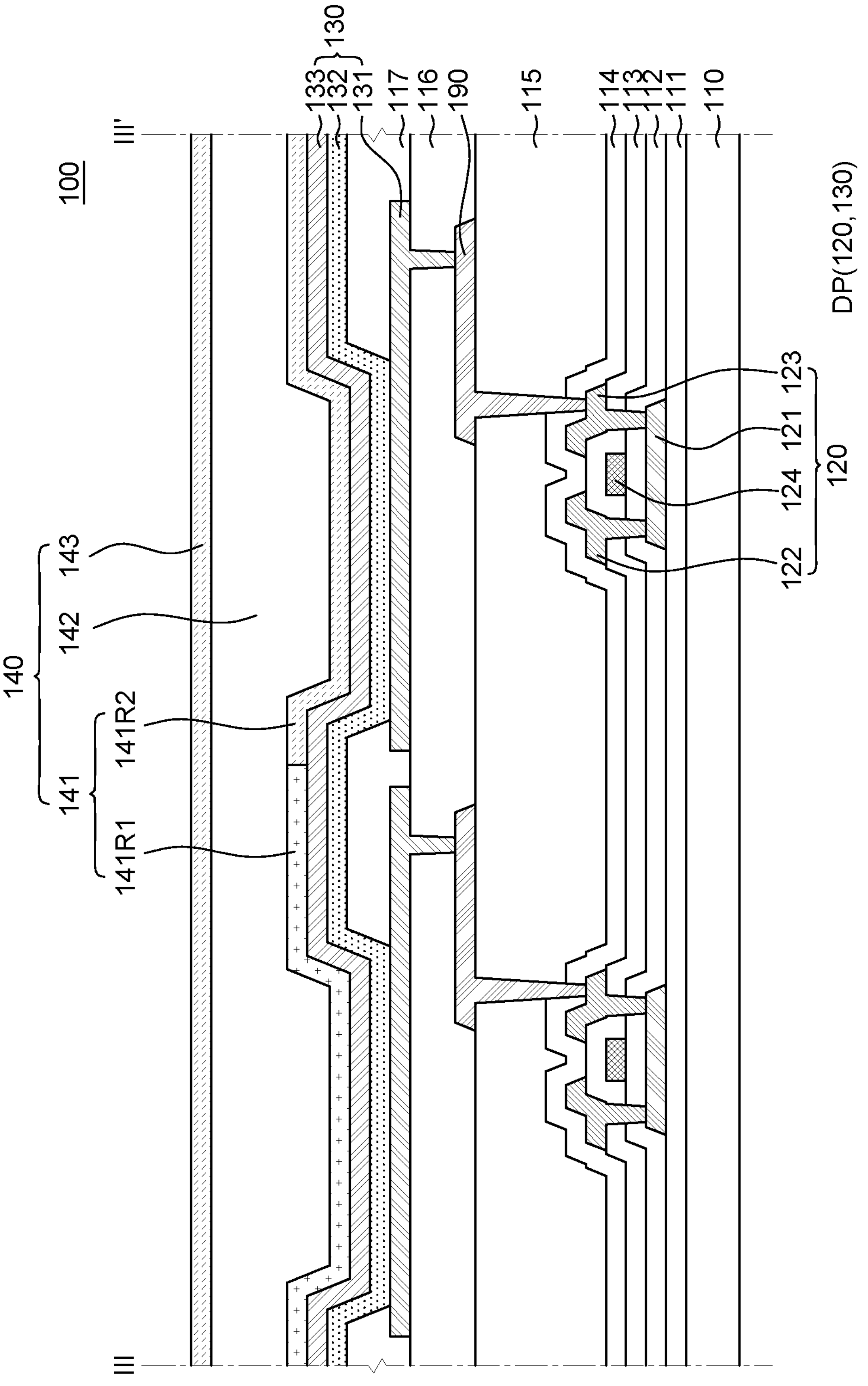
FIG. 3 is a cross-sectional view as taken along a line III-III' of FIG. 1A according to an embodiment of the present disclosure.

FIG. 1B is a plan view illustrating a first inorganic encapsulation layer of the display device according to an example embodiment of the present disclosure. FIG. 2A is a cross-sectional view as taken along a line IIa-IIa' of FIG. 1A. FIG. 2B is a cross-sectional view of when the display device is bent according to an example embodiment of the present disclosure. FIG. 3 is a cross-sectional view as taken along a line III-III' of FIG. 1A. For the convenience of description, FIG. 1B illustrates only the first inorganic encapsulation layer 141 among various components of the display device 100.

First, referring to FIG. 2A and FIG. 2B, in the display device 100 according to an example embodiment of the present disclosure, as the bending area BA is bent, the data driver DD can be disposed under the display area AA (e.g., on a rear side of the display area AA). Specifically, as the bending area BA is bent, the first non-display area NA1 and the data driver DD disposed in the first non-display area NA1 and configured to transfer a signal to the display area AA can be disposed under or behind the display area AA.

In this situation, the first region 141R1 of the first inorganic encapsulation layer 141 is disposed to overlap with the data driver DD. This will be described in detail later.

Referring to FIG. 3, the display device 100 according to an example embodiment of the present disclosure is a top emission type display device. The display device 100 can include the substrate 110, a buffer layer 111, a transistor 120, a gate insulating layer 112, an interlayer insulating layer 113, a passivation layer 114, a first flattening layer 115 (e.g., a first planarization layer), a connection electrode 190, a second flattening layer 116 (e.g., a second planarization layer), a bank 117, a light emitting diode 130 and an encapsulation unit 140. In this situation, the transistor 120 and the light emitting diode 130 can be referred to as a display part DP. That is, the display part DP can include the transistor 120 and the light emitting diode 130.

The substrate 110 can support various components of the display device 100. The substrate 110 can be made of glass or a plastic material having flexibility. The substrate 110 can be made of a plastic material, for example, polyimide (PI).

The buffer layer 111 can be disposed on the substrate 110. The buffer layer 111 can be formed as a single layer or a multilayer of silicon nitride (SiNx) or silicon oxide (SiOx). The buffer layer 111 can serve to enhance an adhesive force between layers formed on the buffer layer 111 and the substrate 110 and block alkali components or the like flowing out or outgassing from the substrate 110.

The transistor 120 can be disposed on the buffer layer 111. The transistor 120 can include an active layer 121, a gate electrode 124, a source electrode 122 and a drain electrode 123. Herein, the source electrode 122 can be a drain electrode and the drain electrode 123 can be a source electrode depending on a design of a pixel circuit. The active layer 121 of the transistor 120 can be disposed on the buffer layer 111.

The active layer 121 can be made of various materials, such as polycrystalline silicon, amorphous silicon, or an oxide semiconductor. The active layer 121 can include a channel region in which a channel is formed when the transistor 120 is driven, and a source region and a drain region on both sides of the channel region. The source region can be a portion of the active layer 121 connected to the source electrode 122, and the drain region can be a portion of the active layer 121 connected to the drain electrode 123.

The gate insulating layer 112 can be disposed on the active layer 121 of the transistor 120. The gate insulating layer 112 can be formed as a single layer or a multilayer of silicon nitride (SiNx) or silicon oxide (SiOx). Contact holes can be formed in the gate insulating layer 112 to connect the source electrode 122 and the drain electrode 123 of the transistor 120 to the source region and the drain region, respectively, of the active layer 121 of the transistor 120.

The gate electrode 124 of the transistor 120 can be disposed on the gate insulating layer 112. The gate electrode 124 can be formed as a single layer or a multilayer of any one of molybdenum (Mo), copper (Cu), titanium (Ti), aluminum (Al), chromium (Cr), gold (Au), nickel (Ni) and neodymium (Nd), or an alloy thereof. The gate electrode 124 can be formed on the gate insulating layer 112 to overlap with the channel region of the active layer 121 of the transistor 120.

The interlayer insulating layer 113 can be disposed on the gate insulating layer 112 and the gate electrode 124. The interlayer insulating layer 113 can be formed as a single layer or a multilayer of silicon nitride (SiNx) or silicon oxide (SiOx). Contact holes can be formed in the interlayer insulating layer 113 to expose the source region and the drain region of the active layer 121 of the transistor 120.

The source electrode 122 and the drain electrode 123 of the transistor 120 can be disposed on the interlayer insulating layer 113.

The source electrode 122 and the drain electrode 123 of the transistor 120 can be connected to the active layer 121 of the transistor 120 through the contact holes formed in the gate insulating layer 112 and the interlayer insulating layer 113. Therefore, the source electrode 122 of the transistor 120 can be connected to the source region of the active layer 121 through the contact holes formed in the gate insulating layer 112 and the interlayer insulating layer 113. Further, the drain electrode 123 of the transistor 120 can be connected to the drain region of the active layer 121 through the contact holes formed in the gate insulating layer 112 and the interlayer insulating layer 113.

The source electrode 122 and the drain electrode 123 of the transistor 120 can be formed by the same process. Further, the source electrode 122 and the drain electrode 123 of the transistor 120 can be made of the same material. The source electrode 122 and the drain electrode 123 of the transistor 120 can be formed as a single layer or a multilayer of any one of molybdenum (Mo), copper (Cu), titanium (Ti), aluminum (Al), chromium (Cr), gold (Au), nickel (Ni) and neodymium (Nd), or an alloy thereof.

The passivation layer 114 can be disposed on the source electrode 122 and the drain electrode 123 to protect the source electrode 122 and the drain electrode 123. The passivation layer 114 is an insulating layer for protecting the components disposed under the passivation layer 114. For example, the passivation layer 114 can be formed as a single layer or a multilayer of silicon oxide (SiOx) or silicon nitride (SiNx), but is not limited thereto. Also, the passivation layer 114 can be omitted depending on an example embodiment.

The first flattening layer 115 can be disposed on the transistor 120 and the passivation layer 114. As shown in FIG. 3, contact holes can be formed in the first flattening layer 115 to expose the drain electrode 123. The first flattening layer 115 can be an organic material layer for flattening an upper portion of the transistor 120. For example, the first flattening layer 115 can be made of an organic material such as acryl resin, epoxy resin, phenolic resin, polyamide resin, polyimide resin, etc., but is not limited thereto. The first flattening layer 115 can be an inorganic material layer for protecting the transistor 120. The first flattening layer 115 can be made of an inorganic material such as silicon nitride (SiNx) or silicon oxide (SiOx). The first flattening layer 115 can be formed as a single layer or a multilayer of silicon nitride (SiNx) or silicon oxide (SiOx). The first flattening layer 115 can also be referred to as a first planarization layer.

The connection electrode 190 can be disposed on the first flattening layer 115. Further, the connection electrode 190 can be connected to the drain electrode 123 of the transistor 120 through the contact hole formed in the first flattening layer 115. The connection electrode 190 can serve to electrically connect the transistor 120 and the light emitting diode 130. For example, the connection electrode 190 can serve to electrically connect the drain electrode 123 of the transistor 120 and a first electrode 131 of the light emitting diode 130. The connection electrode 190 can be formed as a single layer or a multilayer of any one of molybdenum (Mo), copper (Cu), titanium (Ti), aluminum (Al), chromium (Cr), gold (Au), nickel (Ni) and neodymium (Nd), or an alloy thereof. The connection electrode 190 can be made of the same material as the source electrode 122 and the drain electrode 123 of the transistor 120.

The second flattening layer 116 can be disposed on the connection electrode 190 and the first flattening layer 115. Further, as shown in FIG. 3, contact holes can be formed in the second flattening layer 116 to expose the connection electrode 190. The second flattening layer 116 can be an organic material layer for flattening an upper portion of the transistor 120. For example, the second flattening layer 116 can be made of an organic material such as acryl resin, epoxy resin, phenolic resin, polyamide resin, polyimide resin, etc. The second flattening layer 116 can also be referred to as a second planarization layer.

In each of the plurality of pixels P, the light emitting diode 130 can be disposed on the second flattening layer 116. The light emitting diode 130 can include the first electrode 131, which is an anode, an emission layer 132 and a second electrode 133, which is a cathode. The first electrode 131 of the light emitting diode 130 can be disposed on the second flattening layer 116. The first electrode 131 can be electrically connected to the connection electrode 190 through the contact hole formed in the second flattening layer 116. Therefore, the first electrode 131 of the light emitting diode 130 is connected to the connection electrode 190 through the contact hole formed in the second flattening layer 116 and thus can be electrically connected to the transistor 120.

The first electrode 131, which is an anode, can be formed in a multilayered structure including a transparent conductive film and an opaque conductive film having high reflection efficiency. The transparent conductive film can be made of a material having a relatively high work function value such as indium-tin-oxide (ITO) or indium-zinc-oxide (IZO). The opaque conductive film can be formed into a single-layered or multilayered structure including at least one selected from among aluminum (Al), silver (Ag), copper (Cu), lead (Pb), molybdenum (Mo) and titanium (Ti), or an alloy thereof. For example, the first electrode 131 can have a structure in which a transparent conductive film, an opaque conductive film and a transparent conductive film are sequentially laminated. However, the present disclosure is not limited thereto, and the first electrode 131 can have a structure in which a transparent conductive film and an opaque conductive film are sequentially laminated.

The bank 117 can be disposed on the first electrode 131 and the second flattening layer 116. An opening can be formed in the bank 117 to expose the first electrode 131. The bank 117 can also be referred to as a pixel definition film because the bank 117 can define an emission area of the display device 100.

The emission layer 132 is disposed on the first electrode 131. The emission layer 132 can be disposed on an organic layer in which a plurality of organic material layers is laminated.

Specifically, the organic layer of the light emitting diode 130 can be formed on the first electrode 131 by sequentially or reversely laminating a hole injection layer HIL, a hole transport layer HTL, an electron blocking layer EBL, the emission layer EML; 132, an electron transport layer ETL and an electron injection layer EIL. Also, the organic layer can include first and second organic layers facing each other with a charge generation layer interposed therebetween. In this situation, an emission layer of one of the first and second organic layers generates blue light, and an emission layer of the other one of the first and second organic layers generates yellow-green light. Thus, white light can be generated through the first and second organic layers. Since the white light generated by the organic layer is incident on a color filter located on the organic layer, a color image can be implemented. Alternatively, each organic layer can generate color light corresponding to each sub-pixel without a separate color filter to implement a color image. For example, the organic layer of a red sub-pixel can generate red light, the organic layer of a green sub-pixel can generate green light, and the organic layer of a blue sub-pixel can generate blue light.

The second electrode 133, which is a cathode, can further disposed on the emission layer 132. Since the display device 100 is a top emission type display device, the second electrode 133 can be made of a metallic material having a very small thickness or a transparent conductive material. The second electrode 133 of the light emitting diode 130 can be disposed on the emission layer 132 to face the first electrode 131 with the emission layer 132 interposed therebetween. In the display device 100 according to an example embodiment of the present disclosure, the second electrode 133 can be a cathode electrode. The encapsulation unit 140 that suppresses permeation of moisture can be further disposed on the second electrode 133.

The encapsulation unit 140 can include the first inorganic encapsulation layer 141, an organic encapsulation layer 142 and a second inorganic encapsulation layer 143. The first inorganic encapsulation layer 141 of the encapsulation unit 140 can be disposed on the second electrode 133. Further, the organic encapsulation layer 142 can be disposed on the first inorganic encapsulation layer 141. Furthermore, the second inorganic encapsulation layer 143 can be disposed on the organic encapsulation layer 142. The first inorganic encapsulation layer 141 and the second inorganic encapsulation layer 143 of the encapsulation unit 140 can be made of an inorganic material such as silicon nitride (SiNx) or silicon oxide (SiOx). The organic encapsulation layer 142 of the encapsulation unit 140 can be made of an organic material such as acryl resin, epoxy resin, phenolic resin, polyamide resin, polyimide resin, etc.

Referring to FIG. 1A through FIG. 2B again, the first inorganic encapsulation layer 141 can include the first region 141R1 and the second region 141R2. The first region 141R1 and the second region 141R2 of the first inorganic encapsulation layer 141 can be separate elements made of different materials, and the first region 141R1 and the second region 141R2 can have different indexes of refraction.

The first region 141R1 overlaps with the data driver DD and has an improved refractive index in the first inorganic encapsulation layer 141.

Referring to FIG. 1B, the first region 141R1 can be smaller in area than the second region 141R2. The area of the first region 141R1 can be 25% or less of the area of the display area AA.

The second region 141R2 can be a region other than the first region 141R1 in the first inorganic encapsulation layer 141 and the second region 141R2 can have a lower refractive index than the first region 141R1. That is, the second region 141R2 can have a general refractive index of the first inorganic encapsulation layer 141 since the second region 141R2 can make up the majority of the first inorganic encapsulation layer 141.

For example, if the second region 141R2, which is a general portion of the first inorganic encapsulation layer 141, has a refractive index of 1.84, the first region 141R1 can have a refractive index of 1.85 to 2.00. Preferably, the first region 141R1 can have a refractive index of 1.89.

For example, the first region 141R1 and the second region 141R2 can be formed as separate layers and individually patterned. Thus, an interface can exist between the first region 141R1 and the second region 141R2, but is not limited thereto.

Figure 4:
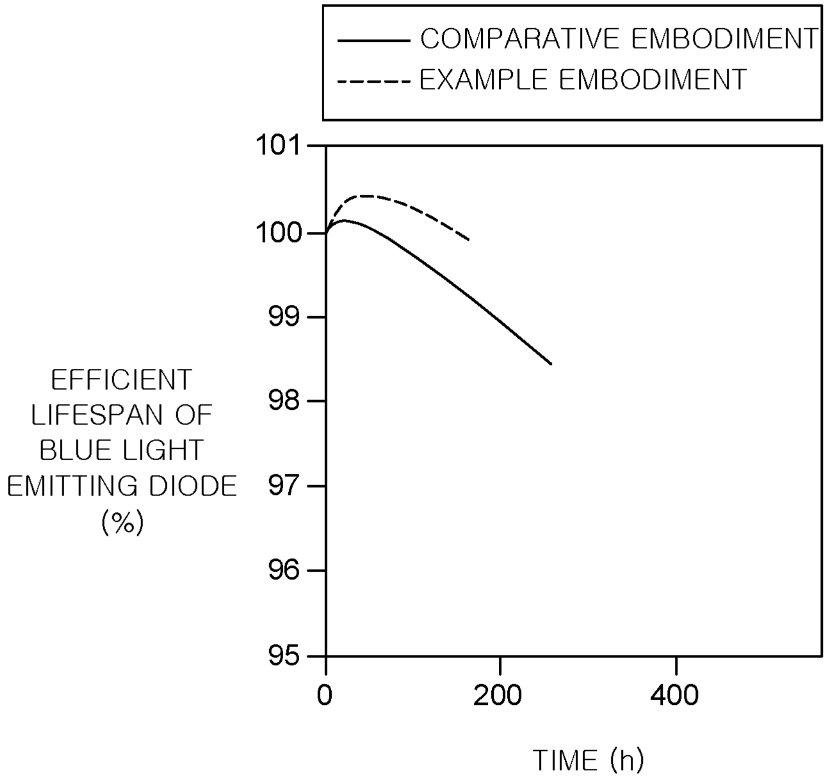
FIG. 4 is a graph showing an efficient lifespan of a blue light emitting diode according to a simulation of a display device according to an embodiment of the present disclosure and a display device according to a Comparative Embodiment.

FIG. 4 is a graph showing an efficient lifespan of a blue light emitting diode according to a simulation of a display device according to an example embodiment of the present disclosure and a display device according to a Comparative Embodiment. In FIG. 4, the X-axis represents a time (h) for which a blue emission layer of a blue sub-pixel emits light and the Y-axis represents an efficient lifespan (%) of the blue emission layer. Herein, the display device according to the Comparative Embodiment is a display device in which only a second region having a lower refractive index than a first region is disposed in a first inorganic encapsulation layer (e.g., the first region is not present in the Comparative Embodiment, rather only the second region is present and the second region extends across the entire display area AA and has a low refractive index).

Referring to FIG. 4, in the display device 100 according to an example embodiment of the present disclosure, the first region 141R1 having an improved refractive index (e.g., a higher refractive index) is disposed in the first inorganic encapsulation layer 141. Thus, an efficient lifespan of a blue emission layer can be improved.

Specifically, referring to FIG. 4, it can be seen that an efficient lifespan of a blue light emitting diode, i.e., a blue emission layer, of the display device 100 according to an example embodiment of the present disclosure is measured higher than that of the display device according to Comparative Embodiment. Accordingly, in the display device 100 according to an example embodiment of the present disclosure, the first region 141R1 having an improved refractive index is disposed in the first inorganic encapsulation layer 141. Thus, an efficient lifespan of the blue emission layer can be improved.

Also, this improvement in efficient lifespan can occur because a path of light is changed based on a change in refractive index of the first inorganic encapsulation layer 141 (e.g., the higher refractive index, then the slower the light travels through the medium and causes the light to bend more as the light passes through the medium having the higher refractive index). Also, this improvement in efficient lifespan can occur because when the light emitting diode 130 is driven, an optimal site of a hole-electron recombination zone is shifted in the blue emission layer which is most vulnerable, and, thus, an efficient lifespan of the blue emission layer is increased.

In the display device 100 according to an example embodiment of the present disclosure, a pinkish or yellowish color shift can be improved by improving a lifespan of the blue light emitting diode.

In the display device of the Comparative Example, a blue light emitting diode reaches the end of life first, before the other colors of light emitting diodes due to a relatively short lifespan of the blue light emitting diode. Thus, a pinkish or yellowish color shift can occur in the display device.

However, in the display device 100 according to an example embodiment of the present disclosure, the first region 141R1 has a high refractive index and is disposed in the first inorganic encapsulation layer 141. Thus, a path of light is changed (e.g., the light is bent more and has a wider dispersion, which can also reduce heat). Therefore, an efficient lifespan of the blue emission layer can be increased. Accordingly, the lifespan of the blue light emitting diode vulnerable to a high temperature environment can be improved. Therefore, in the display device 100 according to an example embodiment of the present disclosure, a pinkish or yellowish color shift can be improved by improving the lifespan of the blue light emitting diode.

Also, in the display device 100 according to an example embodiment of the present disclosure, the lifespan of the blue light emitting diode can be improved and the luminous efficiency can be optimized by minimizing a region where the refractive index of the first inorganic encapsulation layer 141 increases.

As described above, if the refractive index of the first inorganic encapsulation layer 141 is increased, the lifespan of the blue light emitting diode can be improved. Thus, a color shift can be improved or prevented. However, due to an increase in refractive index of the first inorganic encapsulation layer 141, the overall luminous efficiency of the light emitting diodes 130 of the display device 100 may be decreased. For example, the higher refractive index of the first inorganic encapsulation layer 141 can more widely disperse the light emitted from the blue light emitting diodes 130 in order to reduce heat and improve the lifespan, but this can also cause brightness issues.

Therefore, in the display device 100 according to an example embodiment of the present disclosure, the first region 141R1 having an increased refractive index in the first inorganic encapsulation layer 141 is disposed to overlap with the data driver DD where most heat is generated while the display device 100 is driven. For example, the area of the display that overlaps with the data driver DD can experience a type of hotspot, and the placement of the first region 141R1 can help prevent or minimize this type of situation. Thus, it is possible to improve or prevent a decrease in lifespan of the blue light emitting diodes that are most vulnerable particularly to a high temperature environment and suppress a decrease in luminous efficiency of the other portions of the display area that do not overlap with the data driver DD and correspond to the second region 141R2. For example, the operating temperature can be lowered for the blue light emitting diodes in an area that overlaps with or corresponds to the data driver DD by placing the first region 141R1 of first inorganic encapsulation layer 141 with the high refractive index in this area. In this situation, the first region 141R1 can be greater in area than the data driver DD to sufficiently cover a region where a high temperature environment is provided by the data driver DD (e.g., the first region 141R1 can be located over a potential hotspot to prevent or mitigate the issue). Specifically, the area of the first region 141R1 having an increased refractive index in the first inorganic encapsulation layer 141 is limited to 25% or less of the area of the display area AA. Thus, it is possible to minimize any decrease in luminous efficiency of the light emitting diode 130 in the other portion where the first region 141R1 is not disposed. Therefore, in the display device 100 according to an example embodiment of the present disclosure, the lifespan of the blue light emitting diodes can be improved and the luminous efficiency can be optimized by minimizing a region where the first region 141R1 having the high refractive index of the first inorganic encapsulation layer 141 is located.

Hereinafter, a display device 500 according to another example embodiment of the present disclosure will be described with reference to FIG. 5A and FIG. 5B.

Figure 5A:
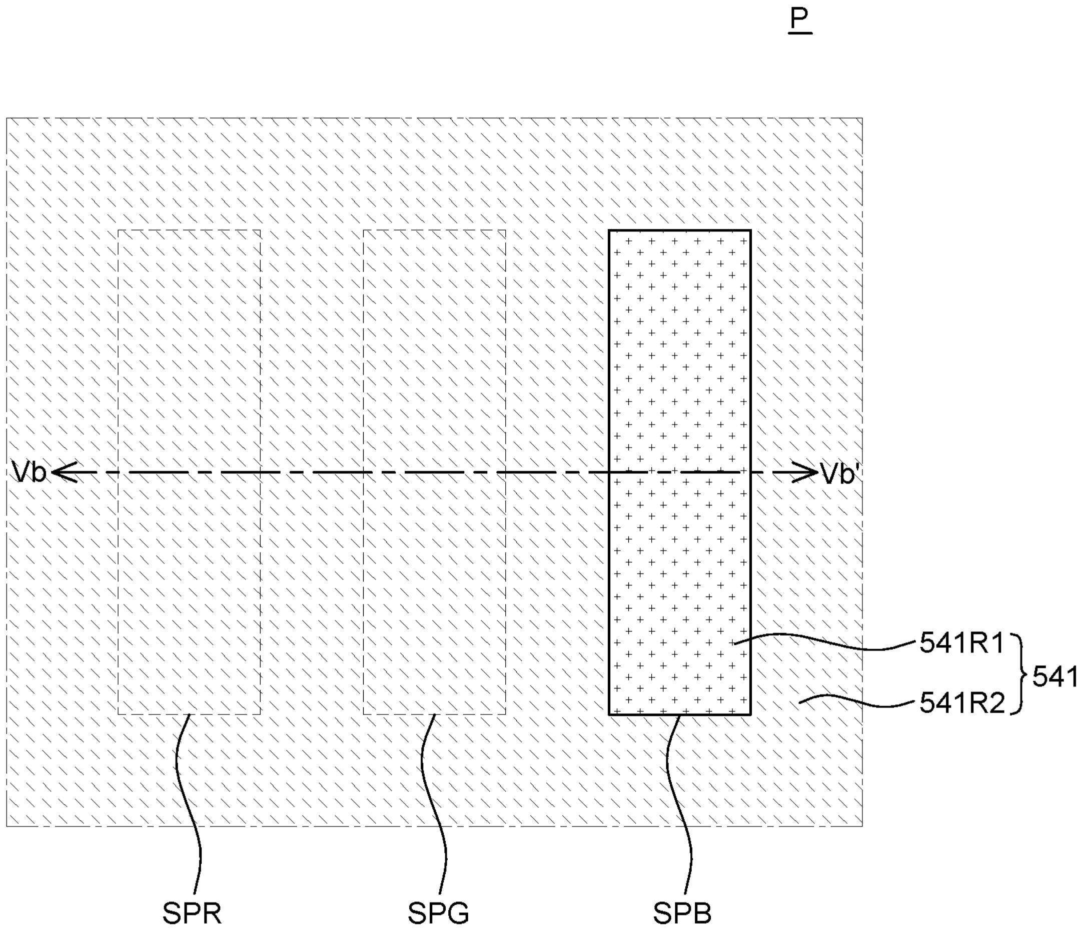
FIG. 5A is an enlarged plan view of one pixel of a display device according to another embodiment of the present disclosure.

FIG. 5A is an enlarged plan view of one pixel of a display device according to another example embodiment of the present disclosure. FIG. 5B is a cross-sectional view as taken along a line Vb-Vb' of FIG. 5A. The display device 500 illustrated in FIG. 5A and FIG. 5B is substantially the same as the display device 100 illustrated in FIG. 1A through FIG. 4 except for the position of a first region 541R1 of a first inorganic encapsulation layer 541. Therefore, a repeated description will not be provided. FIG. 5A illustrates only the first inorganic encapsulation layer 541 among various components disposed in one pixel P of the display device 500 for the convenience of description.

Figure 5B:
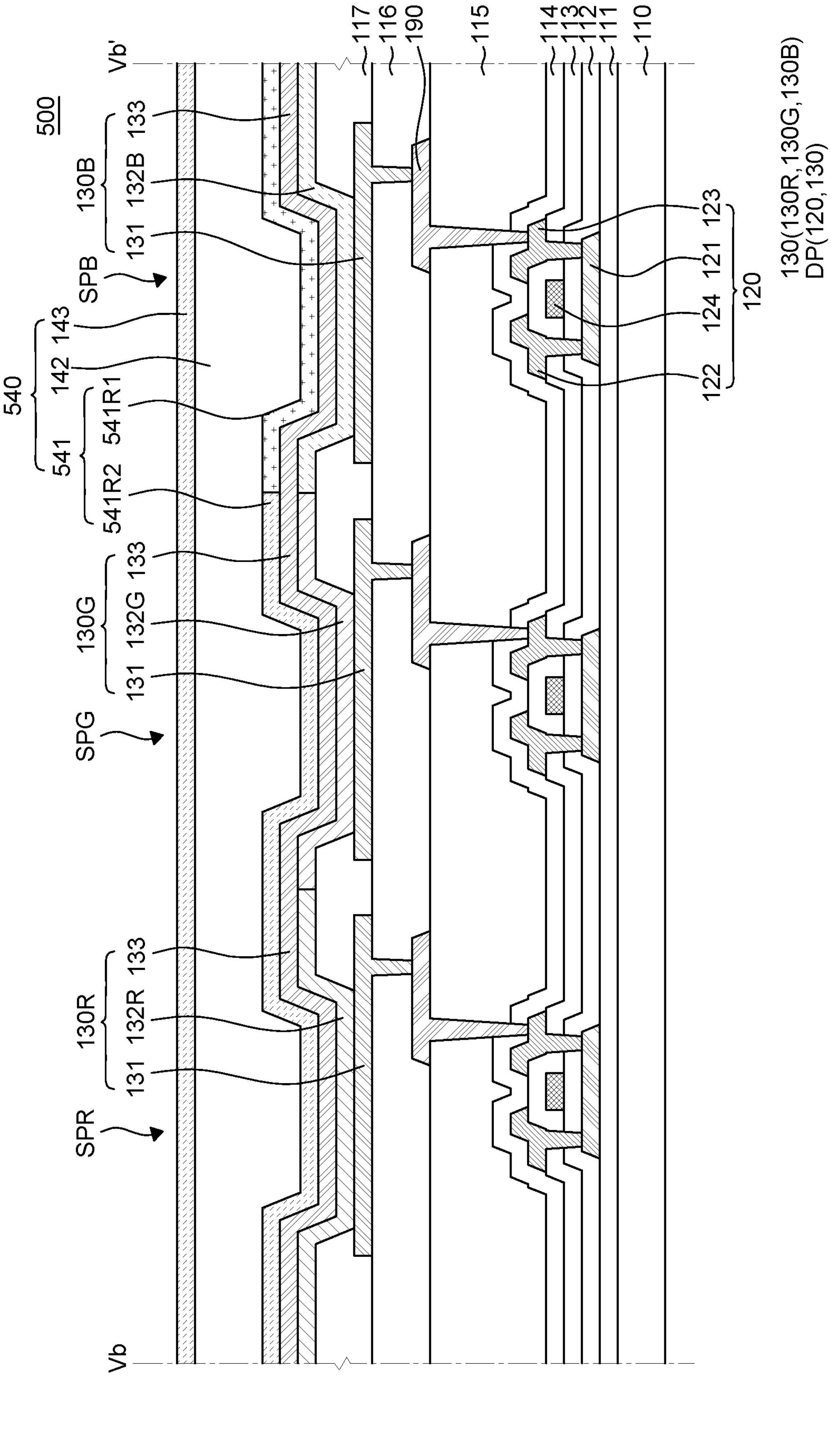
FIG. 5B is a cross-sectional view as taken along a line Vb-Vb' of FIG. 5A according to an embodiment of the present disclosure.

Referring to FIG. 5A and FIG. 5B, each of the plurality of pixels P in the display area AA includes three or more sub-pixels that emit light of different colors from one another. Specifically, each of the plurality of pixels P includes a red sub-pixel SPR, a green sub-pixel SPG and a blue sub-pixel SPB. Also, the light emitting diode 130 and the transistor 120 can be disposed corresponding to each of the red sub-pixel SPR, the green sub-pixel SPG and the blue sub-pixel SPB.

FIG. 5A illustrates that one pixel P of the display device 500 includes the red sub-pixel SPR, the green sub-pixel SPG and the blue sub-pixel SPB. However, the one pixel P can further include a white sub-pixel, but is not limited thereto. Also, FIG. 5A illustrates that all of the red sub-pixel SPR, the green sub-pixel SPG and the blue sub-pixel SPB have a rectangular shape and are disposed parallel to each other. However, the shape and layout of the red sub-pixel SPR, the green sub-pixel SPG and the blue sub-pixel SPB are not limited thereto.

Referring to FIG. 5B, a red light emitting diode 130R including a red emission layer 132R is disposed in the red sub-pixel SPR. Also, a green light emitting diode 130G including a green emission layer 132G is disposed in the green sub-pixel SPG. Further, a blue light emitting diode 130B including a blue emission layer 132B is disposed in the blue sub-pixel SPB. Thus, the red sub-pixel SPR can be configured to emit red light, the green sub-pixel SPG can be configured to emit green light and the blue sub-pixel SPB can be configured to emit blue light.

Referring to FIG. 5B, an encapsulation unit 540 is disposed on a plurality of light emitting diodes 130. The encapsulation unit 540 can include the first inorganic encapsulation layer 541, the organic encapsulation layer 142 and the second inorganic encapsulation layer 143. For example, the organic encapsulation layer 142 can be sandwiched between the first inorganic encapsulation layer 541 and the second inorganic encapsulation layer 143, and different regions of the first inorganic encapsulation layer 541 can have different refractive indexes (e.g., a lower refractive index region for improving brightness, and a higher refractive index region for reducing heat in potential hotspot areas, such as areas located over circuit elements that generate heat during operation, such as the data driver, etc.).

The first inorganic encapsulation layer 541 of the encapsulation unit 540 can disposed on the second electrode 133 of the plurality of light emitting diodes 130. Further, the organic encapsulation layer 142 can be disposed on the first inorganic encapsulation layer 541. Furthermore, the second inorganic encapsulation layer 143 can be disposed on the organic encapsulation layer 142. The first inorganic encapsulation layer 541 and the second inorganic encapsulation layer 143 of the encapsulation unit 540 can be made of an inorganic material such as silicon nitride (SiNx) or silicon oxide (SiOx). The organic encapsulation layer 142 of the encapsulation unit 540 can be made of an organic material such as acryl resin, epoxy resin, phenolic resin, polyamide resin, polyimide resin, etc.

The first inorganic encapsulation layer 541 can include the first region 541R1 and a second region 541R2. The refractive index of the first region 541R1 can be different from that of the second region 541R2. Further, the first region can be disposed to overlap with one of the plurality of sub-pixels disposed in the one pixel P.

Specifically, the first region 541R1 can be a region that overlaps with the blue sub-pixel SPB and has a higher refractive index in the first inorganic encapsulation layer 541. The second region 541R2 can be a region that is located everywhere else except for the first region 541R1 in the first inorganic encapsulation layer 541 and can have a lower refractive index than the first region 541R1. That is, the second region 541R2 can constitute a general refractive index for the first inorganic encapsulation layer 541 since it takes up the most area. For example, if the second region 541R2, which is a general portion of the first inorganic encapsulation layer 541, has a refractive index of 1.84, the first region 541R1 can have a refractive index of 1.85 to 2.00. Preferably, the first region 541R1 can have an overall refractive index or average refractive index of approximately 1.89.

Referring to FIG. 5A and FIG. 5B, the first region 541R1 is disposed to overlap with the blue sub-pixel SPB. For example, the first region 541R1 can be disposed in only the regions that overlap with blue sub-pixels SPB. Further, the red sub-pixel SPR and the green sub-pixel SPG that emit light of different colors than the blue sub-pixel are disposed to overlap with the second region 541R2 which is a region except the first region 541R1. That is, the first region 541R1 can be disposed only in a region that overlaps only with the blue sub-pixel SPB among the plurality of sub-pixels SPR, SPG and SPB.

For example, the first region 541R1 and the second region 541R2 can be formed as separate layers and individually patterned. Thus, an interface can exist between the first region 541R1 and the second region 541R2. However, the method of forming the first region 541R1 and the second region 541R2 is not limited thereto.

Referring to FIG. 5A and FIG. 5B, in the display device 500 according to another example embodiment of the present disclosure, the first region 541R1 having a higher refractive index is disposed in a region of the first inorganic encapsulation layer 541 that overlaps with the blue sub-pixel SPB. Thus, an efficient lifespan of the blue emission layer 132B can be improved and the operating temperature of the blue sub-pixel SPB can be lowered.

Specifically, in the display device 500 according to another example embodiment of the present disclosure, the first region 541R1 having a higher refractive index is disposed in the region of the first inorganic encapsulation layer 541 that overlaps with the blue sub-pixel SPB. Thus, a path of light can be changed based on a change in refractive index of the first inorganic encapsulation layer 541. Therefore, when the light emitting diode 130 is driven, an optimal site of a hole-electron recombination zone is shifted in the blue emission layer 132B which is most vulnerable. Thus, an efficient lifespan of the blue emission layer 132B can be improved, since the blue light emitting diodes can be more efficiently and safely operated. Therefore, in the display device 500 according to another example embodiment of the present disclosure, the first region 541R1 having a higher refractive index is disposed in the region of the first inorganic encapsulation layer 541 that overlaps with the blue sub-pixel SPB, and, thus, an efficient lifespan of the blue emission layer 132B can be improved.

In the display device 500 according to another example embodiment of the present disclosure, a refractive index is increased only in the region of the first inorganic encapsulation layer 541 that overlaps with the blue sub-pixel SPB. Thus, a pinkish or yellowish color shift can be improved.

In the display device of the Comparative Example, a blue light emitting diode reaches the end of life first, before the other color light emitting diodes due to its relatively short lifespan and vulnerability to a high temperature environment. Thus, a pinkish or yellowish color shift can occur in the display device of the Comparative Example.

However, in the display device 500 according to another example embodiment of the present disclosure, the first region 541R1 having a high refractive index is disposed only in the region of the first inorganic encapsulation layer 541 that overlaps with the blue sub-pixel SPB. Thus, a path of light is changed and an efficient lifespan of the blue emission layer 132B can be increased. Accordingly, the lifespan of the blue light emitting diode 130B which has a shorter lifespan than the other color light emitting diodes 130R and 130G and is vulnerable to a high temperature environment can be improved. Also, the difference in lifespan between the blue light emitting diode 130B and the other color light emitting diodes 130R and 130G can be made up and become equal or approximately equal, due to the strategic placement of the first region 541R1. Therefore, in the display device 500 according to another example embodiment of the present disclosure, a pinkish or yellowish color shift can be improved by increasing a refractive index only in the region of the first inorganic encapsulation layer 541 that overlaps with the blue sub-pixel SPB.

Also, in the display device 500 according to another example embodiment of the present disclosure, a lifespan of the blue light emitting diode 130B can be improved and the luminous efficiency can be optimized by minimizing a region that has the high refractive index in the first inorganic encapsulation layer 541.

As described above, if the refractive index of the first inorganic encapsulation layer 541 is increased, the lifespan of the blue light emitting diode 130B can be improved. Thus, a color shift can be improved. However, due to an increase in refractive index of the first inorganic encapsulation layer 541, the overall luminous efficiency of the light emitting diodes 130 of the display device 500 may be decreased.

Therefore, in the display device 500 according to another example embodiment of the present disclosure, the first region 541R1 having an increased refractive index is disposed only in a region of the first inorganic encapsulation layer 541 that overlaps with the blue light emitting diode 130B (e.g., the first region 541R1 does not overlap with any of the other light emitting diodes that emit colors other than blue light). The blue light emitting diode 130B has a shorter lifespan than the other color light emitting diodes 130 while the display device 500 is driven. Thus, it is possible to improve a decrease in lifespan of the blue light emitting diode 130B, which is vulnerable particularly to a high temperature environment and has a relatively short lifespan, and also possible to suppress a decrease in luminous efficiency of the other regions. Therefore, in the display device 500 according to another example embodiment of the present disclosure, the lifespan of the blue light emitting diode 130B can be improved and the luminous efficiency can be optimized by minimizing a region having an increased refractive index in the first inorganic encapsulation layer 541.

The example embodiments of the present disclosure can also be described as follows below.

According to an aspect of the present disclosure, the display device includes a substrate including a display area where a plurality of pixels is disposed, a bending area extending from one side of the display area to be bent, and a non-display area having a first non-display area extending from the bending area. Also, the display device includes a plurality of transistors and a plurality of light emitting diodes disposed on the substrate corresponding to the plurality of pixels, respectively. Further, the display device includes an encapsulation unit disposed on the plurality of light emitting diodes and including a first inorganic encapsulation layer, an organic encapsulation layer and a second inorganic encapsulation layer. Furthermore, the display device includes a data driver disposed in the first non-display area and configured to transfer a signal to the display area. The substrate is bent at the bending area and the first non-display area is disposed under the display area. The first inorganic encapsulation layer includes a first region overlapping with the data driver and a second region except the first region with a lower refractive index than the first region.

The first region having the high refractive index can be smaller in area than the second region having the low refractive index.

The area of the first region can be 25% or less of the area of the display area.

The first region can have a refractive index of 1.85 to 2.00.

The first region can be greater in area than the data driver.

The first region and the second region can be formed as separate layers and an interface exists between the first region and the second region.

According to another aspect of the present disclosure, the display device includes a display panel including a display area where an image is displayed, a non-display area enclosing the display area, and a bending area extending from the non-display area. Also, the display device includes a plurality of light emitting diodes disposed in the display area and a first inorganic encapsulation layer disposed on the plurality of light emitting diodes. Further, the display device includes an organic encapsulation layer disposed on the first inorganic encapsulation layer and a second inorganic encapsulation layer disposed on the organic encapsulation layer. Furthermore, the display device includes a data driver connected to the bending area and disposed on a rear surface of the display panel and configured to transfer a signal to the display panel. The first inorganic encapsulation layer includes a first region disposed corresponding to the data driver and a second region having a lower refractive index than the first region.

An area of the first region having the high refractive index can be 25% or less of an area of the display area.

The first region can have a refractive index of 1.85 to 2.00.

The first region and the second region can be separately disposed.

An interface can exist between the first region and the second region.

The first region can be greater in area than the data driver.

According to yet another aspect of the present disclosure, the display device includes a substrate including a display area where a plurality of pixels each including three or more sub-pixels that emit light of different colors from one another is disposed and a non-display area enclosing the display area, a plurality of transistors and a plurality of light emitting diodes disposed corresponding to each of the sub-pixels, and an encapsulation unit disposed on the plurality of light emitting diodes and including a first inorganic encapsulation layer, an organic encapsulation layer and a second inorganic encapsulation layer. The first inorganic encapsulation layer includes a first region overlapping with any one of the three or more sub-pixels that emit light of different colors from one another, and a second region except the first region with a different refractive index from the first region.

A blue sub-pixel that emits blue light can overlap with the first region.

A sub-pixel that emits light of a different color from the blue sub-pixel can overlap with the second region of the first inorganic encapsulation layer.

The second region can have a lower refractive index than the first region.

The first region can have a refractive index of 1.85 to 2.00.

The first region and the second region can be separately disposed.

An interface can exist between the first region and the second region.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a substrate including:

a display area including a plurality of light emitting diodes, a first non-display area, and a bending area disposed between the first non-display area and the display area;

a first inorganic encapsulation layer disposed on the plurality of light emitting diodes; and a data driver disposed in the first non-display area and configured to transfer a signal to the display area, wherein the substrate is configured to be bent at the bending area for locating a portion of the first non-display area that includes the data driver under or behind a portion of the display area, wherein the first inorganic encapsulation layer includes a first region configured to overlap with the data driver and a second region that does not overlap with the data driver, the first region of the first inorganic encapsulation layer having a higher refractive index than the second region of the first inorganic encapsulation layer, wherein the first region overlaps with a plurality of first light emitting diodes disposed in the portion of the display area overlapping with the data driver, wherein the second region overlaps with a plurality of second light emitting diodes disposed in the display area that do not overlap with the data driver, and wherein the first region of the first inorganic encapsulation layer and the second region of the first inorganic encapsulation layer have a same thickness and are disposed on a same upper surface of a same layer.

2. The display device according to claim 1, wherein the first region of the first inorganic encapsulation layer is made of a different material than the second region of the first inorganic encapsulation layer.

3. The display device according to claim 1, further comprising:

an encapsulation unit disposed on the plurality of light emitting diodes, the encapsulation unit including the first inorganic encapsulation layer, a second inorganic encapsulation layer, and an organic encapsulation layer disposed between the first inorganic encapsulation layer and the second inorganic encapsulation layer.

4. The display device according to claim 1, wherein an area of the first region is smaller than an area of the second region.

5. The display device according to claim 4, wherein the area of the first region is equal to or less than 25% of a total area of the display area.

6. The display device according to claim 1, wherein the first region has a refractive index of 1.85 to 2.00.

7. The display device according to claim 1, wherein an area of the first region is greater than an area the data driver.

8. The display device according to claim 1, wherein the first region of the first inorganic encapsulation layer and the second region of the first inorganic encapsulation layer are formed as separate layers and an interface exists between the first region and the second region.

9. The display device according to claim 1, wherein the first region includes a plurality of first regions respectively disposed over blue light emitting diodes among the plurality of light emitting diodes, and each of the plurality of first regions has a higher refractive index than the second region.

10. The display device according to claim 1, wherein the second region has a refractive index of 1.84.

11. The display device according to claim 1, wherein the plurality of light emitting diodes include red light emitting diodes, green light emitting diodes, and blue light emitting diodes, wherein the second region of the first inorganic encapsulation layer extends across the red light emitting diodes and green light emitting diodes without overlapping with the blue light emitting diodes, and wherein the first region of the first inorganic encapsulation layer overlaps with the blue light emitting diodes and does not overlap with the red light emitting diodes and green light emitting diodes.

12. The display device according to claim 1, wherein the plurality of light emitting diodes include red light emitting diodes, green light emitting diodes, and blue light emitting diodes, and wherein the first region of the first inorganic encapsulation layer is configured to lower an operating temperature of the blue light emitting diodes.

13. The display device according to claim 1, wherein the second region of the first inorganic encapsulation layer surrounds the first region of the first inorganic encapsulation layer in a plan view.

14. The display device according to claim 1, wherein the first region of the first inorganic encapsulation layer is configured to lower an operating temperature of light emitting diodes disposed under the first region.

15. The display device according to claim 1, wherein an upper surface of the first region of the first inorganic encapsulation layer is flush with an upper surface of the second region of the first inorganic encapsulation layer, and wherein a lower surface of the first region of the first inorganic encapsulation layer is flush with a lower surface of the second region of the first inorganic encapsulation layer.

16. The display device according to claim 1, wherein a vertical interface between the first region of the first inorganic encapsulation layer and the second region of the first inorganic encapsulation layer is disposed between adjacent light emitting diodes.

17. The display device of claim 1, wherein the plurality of first light emitting diodes are configured to emit blue light, and wherein the first region does not overlap with a plurality of third light emitting diodes configured to emit light of a color different than the blue light disposed in the portion of the display area overlapping with the data driver.

18. A display device, comprising:

a substrate including:

a display area including a plurality of light emitting diodes, a first non-display area, and a bending area disposed between the first non-display area and the display area;

a first inorganic encapsulation layer disposed on the plurality of light emitting diodes; and a data driver disposed in the first non-display area and configured to transfer a signal to the display area, wherein the substrate is configured to be bent at the bending area for locating a portion of the first non-display area that includes the data driver under or behind a portion of the display area, wherein the first inorganic encapsulation layer includes a first region configured to overlap with the data driver and a second region that does not overlap with the data driver, the first region of the first inorganic encapsulation layer having a higher refractive index than the second region of the first inorganic encapsulation layer, wherein the first region of the first inorganic encapsulation layer and the second region of the first inorganic encapsulation layer have a same thickness and are disposed on a same upper surface of a same layer, wherein the plurality of light emitting diodes include red light emitting diodes, green light emitting diodes, and blue light emitting diodes, and wherein the first region of the first inorganic encapsulation layer is configured to lower an operating temperature of the blue light emitting diodes.

19. A display device, comprising:

a substrate including:

a display area including a plurality of light emitting diodes, a first non-display area, and a bending area disposed between the first non-display area and the display area;

a first inorganic encapsulation layer disposed on the plurality of light emitting diodes; and a data driver disposed in the first non-display area and configured to transfer a signal to the display area, wherein the substrate is configured to be bent at the bending area for locating a portion of the first non-display area that includes the data driver under or behind a portion of the display area, wherein the first inorganic encapsulation layer includes a first region configured to overlap with the data driver and a second region that does not overlap with the data driver, the first region of the first inorganic encapsulation layer having a higher refractive index than the second region of the first inorganic encapsulation layer, wherein the first region of the first inorganic encapsulation layer and the second region of the first inorganic encapsulation layer have a same thickness and are disposed on a same upper surface of a same layer, and wherein the second region of the first inorganic encapsulation layer surrounds the first region of the first inorganic encapsulation layer in a plan view.

* * * * *